United States Patent
Wong et al.

(10) Patent No.: US 9,829,748 B2
(45) Date of Patent: Nov. 28, 2017

(54) METHOD OF UNIT LEVEL LIQUID CRYSTAL DISPLAY DEVICE ASSEMBLY PROCESS FOR LIQUID CRYSTAL ON SILICON

(71) Applicant: Syndiant Inc., Dallas, TX (US)

(72) Inventors: Chun Chiu Daniel Wong, Dallas, TX (US); Hiap Liew Ong, Dallas, TX (US)

(73) Assignee: SYNDIANT INC., Dallas, TX (US)

( * ) Notice: Subject to any disclaimer, the term of this patent is extended or adjusted under 35 U.S.C. 154(b) by 0 days.

(21) Appl. No.: 15/381,247

(22) Filed: Dec. 16, 2016

(65) Prior Publication Data

US 2017/0184924 A1    Jun. 29, 2017

(30) Foreign Application Priority Data

Dec. 25, 2015 (TW) .............................. 104143705 A

(51) Int. Cl.
| | |
|---|---|
| *G02F 1/1337* | (2006.01) |
| *G02F 1/1335* | (2006.01) |
| *G02F 1/1341* | (2006.01) |
| *H01L 21/02* | (2006.01) |
| *H01L 21/78* | (2006.01) |
| *H01L 23/00* | (2006.01) |

(52) U.S. Cl.
CPC ...... *G02F 1/133723* (2013.01); *G02F 1/1341* (2013.01); *G02F 1/133512* (2013.01); *G02F 1/133784* (2013.01); *H01L 21/02076* (2013.01); *H01L 21/78* (2013.01); *H01L 24/85* (2013.01); *G02F 2202/105* (2013.01); *G02F 2202/28* (2013.01)

(58) Field of Classification Search
CPC ......... G02F 1/133723; G02F 1/133512; G02F 1/133784; G02F 1/1341; H01L 21/02076; H01L 21/78; H01L 24/85

See application file for complete search history.

(56) References Cited

U.S. PATENT DOCUMENTS

| | | | | |
|---|---|---|---|---|
| 5,963,289 A | * | 10/1999 | Stefanov ........... | G02F 1/133351 349/187 |
| 2004/0017537 A1 | * | 1/2004 | Magana ............ | G02F 1/133351 349/187 |

(Continued)

*Primary Examiner* — Karen Kusumakar
(74) *Attorney, Agent, or Firm* — McClure, Qualey & Rodack, LLP

(57) ABSTRACT

The present invention provides a method of unit level liquid crystal display device assembly process for liquid crystal on silicon. It starts with sawing silicon wafer and ITO glass substrate. Then good silicon dies and ITO glass dies will be picked and transferred to separate carriers. Alignment layers will respectively be coated on each silicon die and ITO glass die after cleaning. Then there are two options for the following steps. In method one, silicon die and ITO glass die lamination comes after coating frame adhesive. Then frame adhesive is cured. The liquid crystal will fill the cell and then seal the fill port. Die mounting, wire bonding and encapsulation will come along with external ITO connection to call it an end. In method two, frame adhesive precedes internal connection and LC one drop fill. Then silicon die and ITO glass die are laminated before frame adhesive cure. Afterwards die mount, wire bonding and encapsulation come last.

18 Claims, 4 Drawing Sheets

(56) References Cited

U.S. PATENT DOCUMENTS

2006/0061519 A1\* 3/2006 Fisher .............. G02F 1/133528
 345/32
2014/0085579 A1\* 3/2014 Fan ...................... G02F 1/1339
 349/123

\* cited by examiner and more specifically, the present invention relates to a method of unit level liquid crystal display device assembly process for liquid crystal on silicon (LCOS).

METHOD OF UNIT LEVEL LIQUID CRYSTAL DISPLAY DEVICE ASSEMBLY PROCESS FOR LIQUID CRYSTAL ON SILICON

This application claims priority to Taiwan Patent Application No. 104143705 filed on Dec. 25, 2015.

CROSS-REFERENCES TO RELATED APPLICATIONS

Not applicable.

BACKGROUND OF THE INVENTION

Field of the Invention

The present invention relates to a method of unit level liquid crystal display device assembly process, and more specifically, the present invention relates to a method of unit level liquid crystal display device assembly process for liquid crystal on silicon (LCOS).

Descriptions of the Related Art

As shown in FIG. 1, a conventional method of a liquid crystal display device assembly process for liquid crystal on silicon is provided, including following steps: cleaning silicon wafer and glass substrate 101; coating an alignment layer 102; coating frame adhesive 103; laminating the silicon wafer and the glass substrate 104; sawing the silicon wafer and the glass substrate which are singulated into cells by cell singulation 105; filling the cell with liquid crystal in a vacuum chamber 106; sealing a liquid crystal fill port 107; mounting 108; bonding wire 109; and encapsulating 120. FIG. 2 is another conventional method, including following steps: cleaning silicon wafer and glass substrate 201; coating alignment layers 202; coating frame adhesive 203; internal connecting glass substrate electrically 204; filling with liquid crystal by one drop filling (ODF) process 205; laminating the silicon wafer and the glass substrate into a laminated body 206; sawing the laminated body into cells 207; mounting 208; bonding wire 209; and encapsulating 210.

However, the prior art is not suitable for same set of equipment in different wafer size process (6-in, 8-in, or 12-in). For example, in the oblique evaporation process for coating alignment layer, the bigger the wafer size is, the bigger the vacuum deposition system requires. Therefore, coating alignment layer will take more time. Additionally, it will also take more time to fill with liquid crystal because of a bigger wafer size. Furthermore, because the prior art is applied to a whole wafer, the good bare dies cannot be picked in early step of process, the bad bare dies are also processed with good bare dies, thus it will take a lot of unnecessary expense. And the bond pad of the prior art is only on one of the two scribe and break areas. Further, the development time is longer because the cycle time of the process of the prior art is too long. And the circuit board of the liquid crystal module cannot be fabricated earlier than the liquid crystal assembly process.

The present invention is, therefore, arisen to obviate or at least mitigate the above mentioned disadvantages.

SUMMARY OF THE INVENTION

Accordingly, the present invention provides a method of unit level liquid crystal display device assembly process for liquid crystal on silicon (LCOS), which is unrestricted by the wafer size. The same set of equipment is suitable for different wafer size process (6-in, 8-in, or 12-in). For example, in the oblique evaporation process for coating alignment layer, the same vacuum deposition system can be used in different wafer-size process. And because the unit level die after sawing are much smaller than the wafer, the required volume of the vacuum chamber is much smaller. Therefore, coating alignment layer will take less time. Furthermore, because the good bare dies are picked in early step of process, it will not take a lot of unnecessary expense on the bad dies. Additionally, filling with liquid crystal will not be complicated because the process condition (parameter, size . . . etc) of the unit level dies after sawing is consistent. And the bond pad can be put on any side of the four sides. In addition, the development time is reduced because the cycle time of the present invention is much shorter. And the circuit board of the liquid crystal module can be fabricated earlier than the liquid crystal display device assembly process.

Specifically, the present invention provides a method of unit level liquid crystal display device assembly process for LCOS. The main components of this invention are the die carrier and process apparatus, in which the carrier uses a process similar to wafer level fan-out packaging process, as one of the important technical features. The carrier has an individual LCOS cell carrier sequence, can carry a different number of dies, and ensure that each individual die can be located with an accurate orientation to carry out liquid crystal display device assembly process. Every time, after the liquid crystal display device assembly process is completed, all carriers will be cleaned in order to make the next batch of LCOS cell. In some embodiments of the present invention, the carrier can also have lateral arm or backside vacuum jack to hold the dies.

Specifically, in some embodiments of the present invention, a method of unit level liquid crystal display device assembly process for liquid crystal on silicon includes the following steps: sawing a silicon wafer and an ITO glass substrate into a plurality of silicon dies and a plurality of ITO glass dies respectively; cleaning the silicon dies and the ITO glass dies; picking one said silicon die and one said ITO glass die from the plurality of silicon dies and the plurality of ITO glass dies; coating a first alignment layer and a second alignment layer on the silicon die and the ITO glass die respectively; coating frame adhesive on the silicon die and laminating the silicon die and the ITO glass die; then frame adhesive cure. Subsequently pick suitable LCOS cell from the carrier, and fill with liquid crystal in vacuum chamber. After end seal the liquid crystal fill port, mounting the silicon die onto an external circuit board; bonding a wire between the silicon die and the external circuit board to electrically connect the silicon die and the external circuit board; and electrically connecting the external circuit board with the ITO glass die with an external electrical conductive material. In some embodiments of the present invention, the frame adhesive is applied on the ITO glass die. Besides, the silicon die and the glass die are separately transferred to carriers after picking step for alignment layer coating. In some embodiments of the present invention, the first alignment layer used the same alignment material and process as the second alignment layer, that is, both first and second alignment layers are the same alignment layer. In some embodiments of the present invention, the first alignment layer is different with the second alignment layer.

Furthermore, in some embodiments of the present invention, a method of unit level liquid crystal display device assembly process for liquid crystal on silicon includes the following steps: sawing a silicon wafer and an ITO glass substrate into a plurality of silicon dies and a plurality of ITO glass dies respectively; cleaning the silicon dies and the ITO glass dies; picking one said silicon die and one said ITO glass die from the plurality of silicon dies and the plurality of ITO glass dies; coating a first alignment layer and a second alignment layer on the silicon die and the ITO glass die respectively; coating frame adhesive on the silicon die; connecting the silicon die with an internal electrical conductive material; filling with liquid crystal; laminating the ITO glass die and the silicon die, wherein the silicon die and the ITO glass die are electrically connected via the internal electrical conductive material, the internal electrical conductive material is located between the silicon die and the ITO glass die; curing the frame adhesive; mounting the silicon die onto an external circuit board; and bonding a wire between the silicon die and the external circuit board to electrically connect the silicon die and the external circuit board. In some embodiments of the present invention, the frame adhesive is applied on the silicon die; and in some embodiments of the present invention, the frame adhesive is applied on the ITO glass die. Besides, the silicon die and the glass die are separately transferred to carriers after picking step. In some embodiments of the present invention, the first alignment layer used the same alignment material and process as the second alignment layer, that is, both first and second alignment layers are the same alignment layer. In some embodiments of the present invention, the first alignment layer is different with the second alignment layer.

The present invention will be more fully understood in view of the following description and drawings. Other objectives and advantages of the present invention will be described with reference to the following description and the attached drawings.

DESCRIPTION OF THE PREFERRED EMBODIMENT

Figure 1:
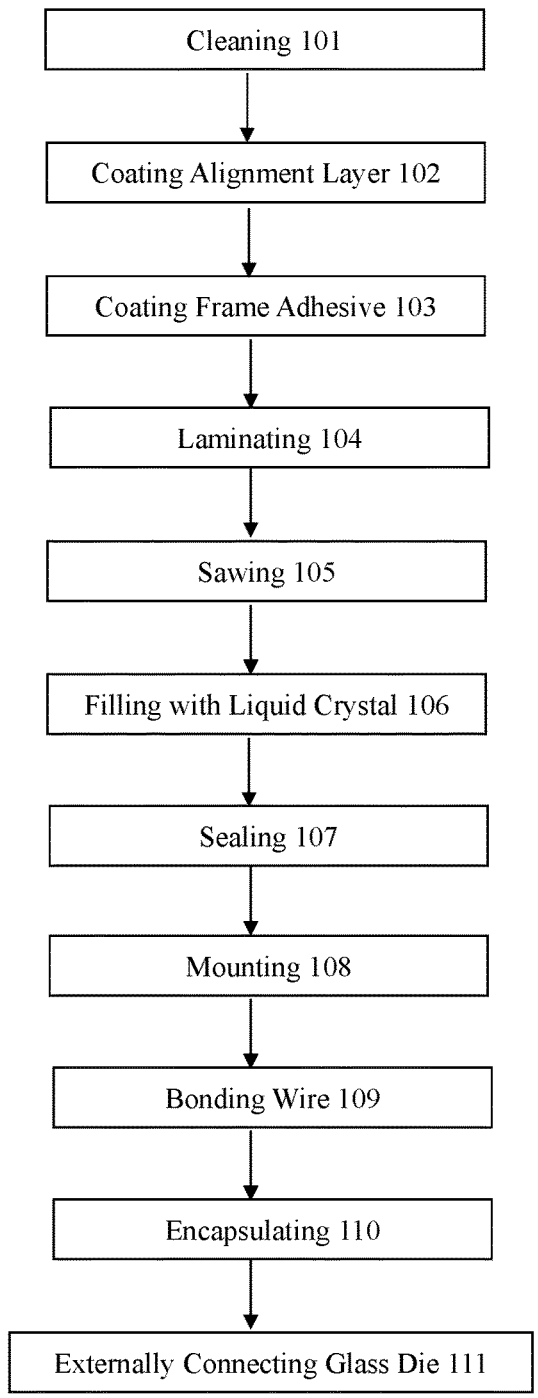
FIG. 1 illustrates a liquid crystal display device assembly process in accordance with a first embodiment of the prior art.
Figure 2:
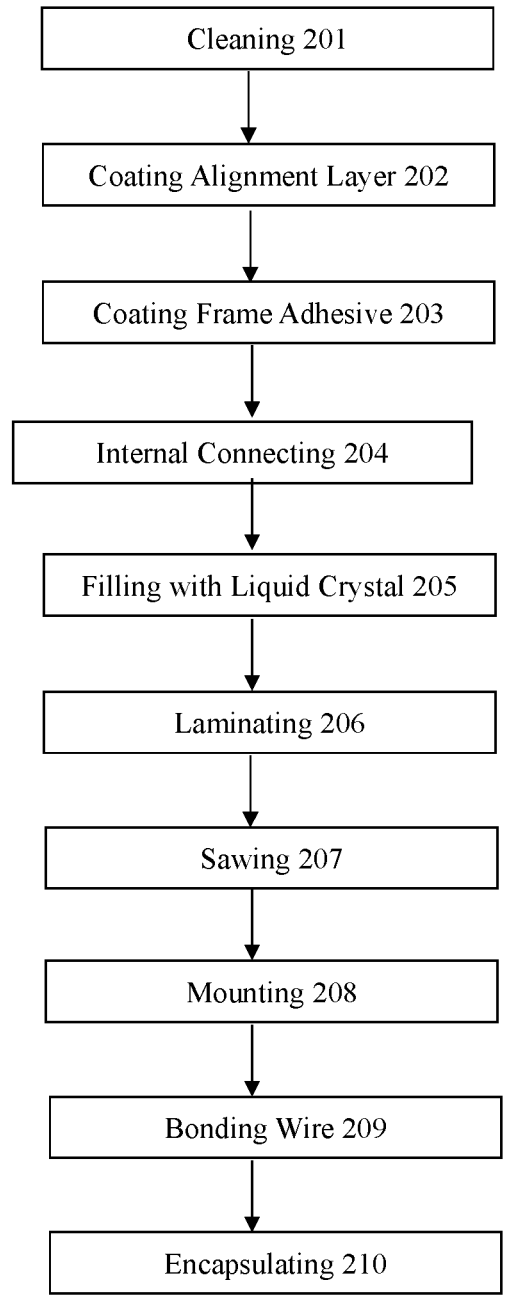
FIG. 2 illustrates a liquid crystal display device assembly process in accordance with a second embodiment of the prior art.
Figure 3:
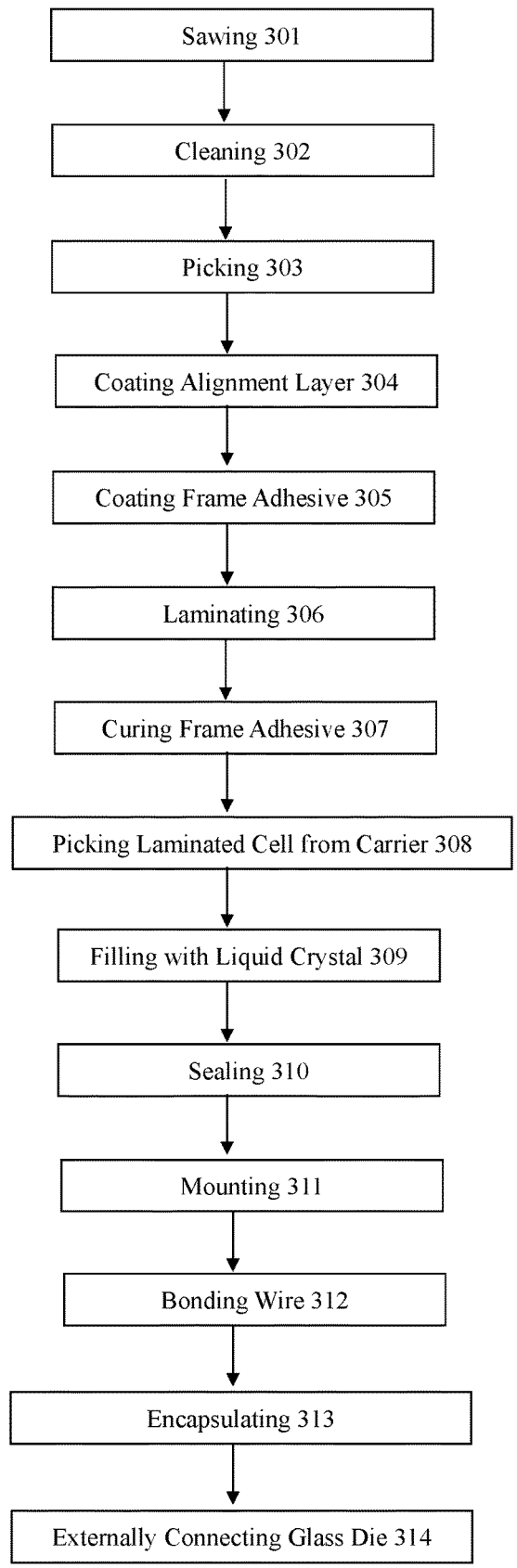
FIG. 3 illustrates a liquid crystal display device assembly process in accordance with a first embodiment of the present invention.

FIG. 3 shows a liquid crystal display device assembly process 300 in accordance with one embodiment of the present invention. Specifically, FIG. 3 which illustrates a method of unit level liquid crystal display device assembly process for liquid crystal on silicon, including the following steps.

A silicon wafer and an ITO glass substrate are sawed into a carrier of silicon dies and a carrier of ITO glass dies respectively 301. Furthermore, the silicon die and the ITO glass die are sawed in unit level so as to be assembled into a LCOS (Liquid Crystal On Silicon) cell. For example, a LCOS panel with a 720P resolution, which is single panel field sequential color LCOS with digital drive, consists of 1280×720 pixel array of 6.4×6.4-um square dot size, 0.37-in of active display diagonal size, and package size of 7.75-mm width×25.4-mm length. The "unit level" may refer to the LCOS cell with an active area of 0.37-in in diagonal size, so that the silicon die and ITO glass die are much smaller than the silicon wafer and the glass substrate (6, 8 or 12 inch).

Next, the silicon dies and the ITO glass dies are cleaned 302.

Then, one said silicon die and one said ITO glass die are picked from the plurality of silicon dies and the plurality of ITO glass dies respectively 303. Moreover, in this step 303, only the good silicon die and the good ITO glass die are picked and used in following step to avoid performing extra process on the bad dies, so that, the cost will be reduced. Next, the silicon die and the ITO glass die are separately transferred to carriers after picking step 303. Wherein each said carrier has an array of cells with each cell placed in an individual cell cavity formed on the carriers. Each said cell cavity ensures that each individual silicon die or ITO glass die can be placed with an accurate orientation to carry out liquid crystal display device assembly process. In some embodiments, each said cell cavity further has side arms or vacuum jack from the back to hold the silicon die or the ITO glass die.

Then, a first alignment layer and a second alignment layer are coated on the silicon die and the ITO glass die respectively 304. Specifically, the first alignment layer and the second alignment layer are coated on a first conductive layer on the silicon die display active area and a second electrical layer on the ITO glass die display active area respectively. In some embodiments of the present invention, the first alignment layer used the same alignment material and process as the second alignment layer, that is, both first and second alignment layers are the same alignment layer. In some embodiments of the present invention, the first alignment layer is different with the second alignment layer.

Then, frame adhesive is coated on the silicon die 305 (in some embodiments, the frame adhesive may be coated on the ITO glass die), and the silicon die and the ITO glass die are laminated into a laminated cell 306. In this step 305, one of the silicon die and the ITO glass die which is placed on the carrier should be transferred to another carrier to laminate.

Next, the frame adhesive is cured 307. Wherein, the frame adhesive, the first alignment layer and the second alignment layer enclose a liquid crystal chamber. And the liquid crystal chamber has a fill port.

Then, the laminated cell is picked from the carrier 308.

Next, the liquid crystal chamber of the laminated cell is filled with liquid crystal in vacuum chamber via the fill port 309 and the fill port is sealed 310, so that the laminated cell becomes a LCOS cell.

Then, the silicon die is mounted onto an external circuit board 311.

Next, a wire is bonded between the silicon die and the external circuit board to electrically connect the silicon die and the external circuit board 312.

Then, an encapsulating process is performed 313.

Next, the external circuit board is electrically connected with the ITO glass die 314 with an external conductive material.

Figure 4:
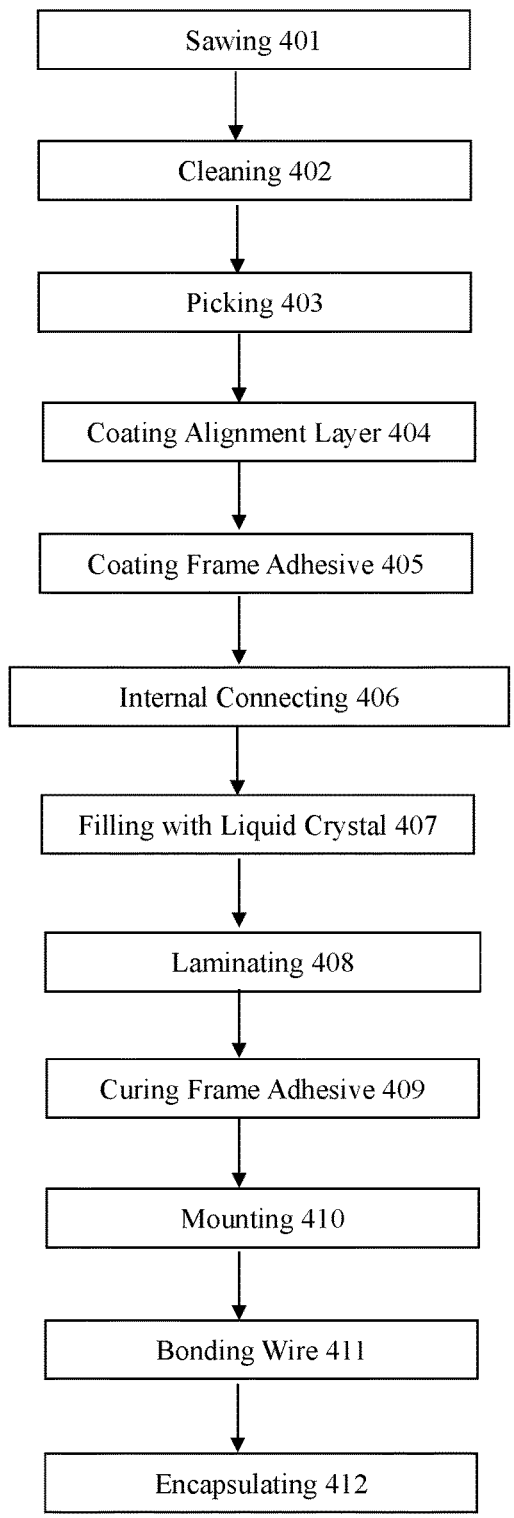
FIG. 4 illustrates a liquid crystal display device assembly process in accordance with a second embodiment of the present invention.

FIG. 4 shows a liquid crystal display device assembly process 400 in accordance with one embodiment of the present invention. Specifically, FIG. 4 illustrates a method of unit level liquid crystal display device assembly process for liquid crystal on silicon, including the following steps.

A silicon wafer and an ITO glass substrate are sawed into a plurality of silicon dies and a plurality of ITO glass dies respectively 401. The Silicon wafer and the ITO glass are mounted on a tape respectively prior to sawing step 401.

Then, both silicon dies on wafer tape and ITO glass dies on wafer tape are subjected to a cleaning step 402 to ensure the cleanliness of the silicon dies and the ITO glass dies. Next, the good silicon die and the good ITO glass die are picked 403 and separately transferred to different carriers. Wherein each said carrier has an array of cell cavities to carry a different number of dies, and each said cell cavity ensures that each individual silicon die or ITO glass die can be located with an accurate orientation to carry out alignment layer coating process. In some embodiments, each said cell cavity further has side arms or vacuum jack from the back to hold the silicon die or the ITO glass die.

Next, a first alignment layer and a second alignment layer are coated on the silicon die and the ITO glass die respectively 404. In some embodiments of the present invention, the first alignment layer used the same alignment material and process as the second alignment layer, that is, both first and second alignment layers are the same alignment layer. In some embodiments of the present invention, the first alignment layer is different with the second alignment layer.

After alignment layer coating step, the silicon die and the ITO glass die should be placed on the same carrier.

Then, frame adhesive is coated on the silicon die or the ITO glass die 405.

Next, one of the silicon die and the ITO glass die is connected with an internal electrical conductive material 406.

Then, liquid crystal is filled 407. Moreover, the liquid crystal is filled by One Drop Fill (ODF) process.

Next, the silicon die and the ITO glass die are laminated 408. Wherein, the ITO glass die is adhered to the silicon die by frame adhesive, the silicon die and the ITO glass die are electrically connected via the internal electrical conductive material, the internal electrical conductive material is located between the silicon die and the ITO glass die. More specifically, the internal electrical conductive material is electrically connected with a first conductive layer on the silicon die and a second electrical layer on the ITO glass die respectively.

Then, the frame adhesive is cured 409.

Next, the silicon die is mounted onto an external circuit board 410.

Then, a wire is bonded between the silicon die and the external circuit board to electrically connect the silicon die and the external circuit board 411.

Next, an encapsulating process is performed 412.

In the embodiments of FIGS. 3-4, the first alignment layer or the second alignment layer is coated by an oblique evaporation process ($SiO_x/SiO_2$ process). In a high vacuum chamber, $SiO_x$ or $SiO_2$ (or other inorganic material) is thermally evaporated and forming SiO columnar bodies on the silicon die or ITO glass die in a specific angle, so that the angle or the density of the alignment layer can be controlled precisely.

The first alignment layer or the second alignment layer may be coated by a polyimide (PI) rubbing process. First, a polyimide (PI) layer is coated on the silicon die or the ITO glass die. Then, a rubbing roll rolls on the PI layer to arrange main chains of PI in a specific direction. The PI rubbing process can be performed in room temperature and a mature process for mass production.

The first alignment layer or the second alignment layer may be coated by a photo alignment process. A photo alignment layer containing structurally anisotropic polymers is formed. UV rays are irradiated to the photo alignment layer to arrange main chains of the structurally anisotropic polymers in a specific direction. The structurally anisotropic polymers may be Cyclic Olefin Copolymers. The main chains of the Cyclic Olefin Copolymers have good characteristics of photosensitivity, photo alignment, alignment property, and thermal stability.

The first alignment layer or the second alignment layer may be coated by an ink-jet printing process to form at least one polymer layer with defined thickness. Because the ink-jet printing process is contactless, the alignment layer can be more smooth and homogeneous. Additionally, the ink-jet printing process can use material efficiently and reduce waste.

In some embodiments of the present invention, the external circuit board is located on a frame edge of a LCOS panel, a light mask on a top surface of the ITO glass die may be fabricated by an ink-jet printing process to reduce phenomenon of reflecting or scattering, so that optical contrast of the LCOS panel will be higher. Furthermore, the light mask is a light absorbing mask, which is able to absorb and avoid light from scattering or reflecting.

Besides, a predetermined picture or photo resist can be coated precisely by software, instead of preparing another expensive mask, so that the cost can be reduced. In addition, if there are at least two spray nozzles on each equipment (for alignment layer or light mask), the more dies can be coated at the same time, so that the efficiency of production can rise.

In some embodiments of the present invention, the first alignment layer or the second alignment layer may be coated by a chemical vapor deposition process in a vacuum chamber. First, the die is put in the vacuum chamber. Then, the vacuum chamber is purged and then filled with an inert gas to reduce water vapor. Next, the liquid crystal alignment layer is coated by using vapor deposition of a silane material. The silane material may be Perfluorooctyltriethoxsilane, Octyltriethoxysilane, Trimethylsiyldiethylamine or Trichlorosilane. Furthermore, the chemical vapor deposition process may be a plasma-enhanced chemical vapor deposition process. By using this process, multiple dies can be placed in the chamber together to coat alignment layers simultaneously. Thus, the processes can produce very thin liquid crystal alignment layers at a high production rate.

As will be appreciated by those skilled in the art, the present invention is not limited to the detailed descriptions of the embodiments disclosed above, but may also be embodied in other specific forms without departing from the spirits of the present invention. The embodiments are provided only for purpose of illustration but not for limitation, and the present invention shall be governed by the claims but not by the aforesaid descriptions. All variations made within the spirits of the claims and equivalents thereof shall all be covered within the scope of the present invention.

What is claimed is:
1. A method of unit level liquid crystal display device assembly process for liquid crystal on silicon, including the following steps:
   sawing a silicon wafer and an ITO glass substrate into a plurality of silicon dies and a plurality of ITO glass dies respectively;
   cleaning the silicon dies and the ITO glass dies;
   picking one said silicon die and one said ITO glass die from the plurality of silicon dies and the plurality of ITO glass dies respectively;
   coating a first alignment layer and a second alignment layer on the silicon die and the ITO glass die respectively;
   coating frame adhesive on the silicon die or the ITO glass die;

curing the frame adhesive, wherein the frame adhesive, the first alignment layer and the second alignment layer enclose a liquid crystal chamber, and the liquid crystal chamber has a fill port;

filling the liquid crystal chamber with liquid crystal via the fill port and sealing the fill port;

mounting the silicon die onto an external circuit board;

bonding a wire between the silicon die and the external circuit board to electrically connect the silicon die and the external circuit board; and electrically connecting the external circuit board with the ITO glass die with an external conductive material.

2. The method of claim 1, wherein the first alignment layer or the second alignment layer is coated by one of a polyimide rubbing process, an oblique evaporation process, a photo alignment process and an ink-jet printing process.

3. The method of claim 1, wherein the first alignment layer or the second alignment layer is coated by a chemical vapor deposition process in a vacuum chamber.

4. The method of claim 3, wherein the chemical vapor deposition process is a plasma-enhanced chemical vapor deposition process.

5. The method of claim 1, further including a following step:
fabricating a light mask on a top surface of the ITO glass die by an ink-jet printing process.

6. The method of claim 1, wherein the silicon die and the ITO glass die are separately transferred to carriers after picking step.

7. The method of claim 6, wherein each said carrier has an array of cell cavities, each said cell cavity has precise dimension to hold one said silicon die or one said ITO glass die.

8. The method of claim 7, wherein the cell cavity further has side arms to hold the silicon die or the ITO glass die.

9. The method of claim 1, further including a following step between the step of bonding a wire between the silicon die and the external circuit board and the step of electrically connecting the external circuit board with the ITO glass die:
performing an encapsulating process.

10. A method of unit level liquid crystal display device assembly process for liquid crystal on silicon, including the following steps:
sawing a silicon wafer and an ITO glass substrate into a plurality of silicon dies and a plurality of ITO glass dies respectively;

cleaning the silicon dies and the ITO glass dies;

picking one said silicon die and one said ITO glass die from the plurality of silicon dies and the plurality of ITO glass dies respectively;

coating a first alignment layer and a second alignment layer on the silicon die and the ITO glass die respectively;

coating frame adhesive on the silicon die or the ITO glass die;

connecting one of the silicon die and the ITO glass die with an internal electrical conductive material;

filling with liquid crystal;

laminating the ITO glass die and the silicon die, wherein the ITO glass die is adhered to the silicon die by frame adhesive, the silicon die and the ITO glass die are electrically connected via the internal electrical conductive material, the internal electrical conductive material is located between the silicon die and the ITO glass die;

curing the frame adhesive;

mounting the silicon die onto an external circuit board; and bonding a wire between the silicon die and the external circuit board to electrically connect the silicon die and the external circuit board.

11. The method of claim 10, wherein the first alignment layer or the second alignment layer is coated by one of a polyimide rubbing process, an oblique evaporation process, a photo alignment process and an ink-jet printing process.

12. The method of claim 10, wherein the first alignment layer and the second alignment layer is coated by a chemical vapor deposition process in a vacuum chamber.

13. The method of claim 12, wherein the chemical vapor deposition process is a plasma-enhanced chemical vapor deposition process.

14. The method of claim 10, further including a following step:
fabricating a light mask on a top surface of the ITO glass die by an ink-jet printing process.

15. The method of claim 10, wherein the silicon die and the ITO glass die are separately transferred to different carriers after picking step.

16. The method of claim 15, wherein each said carrier has an array of cell cavities, each said cell cavity has precise dimension to hold one said silicon die or one said ITO glass die.

17. The method of claim 16, wherein the cell cavity further has side arms to hold the silicon die or the ITO glass die.

18. The method of claim 10, further including a following step after the step of bonding the wire between the silicon die and the external circuit board:
performing an encapsulating process.

* * * * *